United States Patent [19]

Hofmann

[11] Patent Number: 4,801,936
[45] Date of Patent: Jan. 31, 1989

[54] BROADBAND SIGNAL SWITCHING APPARATUS

[75] Inventor: Ruediger Hofmann, Gilching, Fed. Rep. of Germany

[73] Assignee: Siemens Aktiengesellschaft, Berlin and Munich, Fed. Rep. of Germany

[21] Appl. No.: 98,024

[22] Filed: Sep. 17, 1987

[30] Foreign Application Priority Data

Sep. 17, 1986 [DE] Fed. Rep. of Germany ....... 3631634

[51] Int. Cl.$^4$ ................................................ H04Q 1/00
[52] U.S. Cl. ................................ 340/825.91; 307/468; 340/825.9
[58] Field of Search ..................... 307/465, 468; 340/825.85, 825.86, 825.89, 825.9, 825.91, 825.93; 379/292

[56] References Cited

U.S. PATENT DOCUMENTS

| | | | |
|---|---|---|---|
| 3,980,831 | 9/1976 | Mertel | 179/2 R |
| 4,467,439 | 8/1984 | Rhodes | 307/465 X |
| 4,577,190 | 3/1986 | Law | 340/825.91 X |
| 4,745,409 | 5/1988 | Hofmann | 379/292 X |
| 4,746,921 | 5/1988 | Hofmann | 340/825.91 X |

FOREIGN PATENT DOCUMENTS 61-101121  5/1986  Japan .

OTHER PUBLICATIONS

Pfannschmidt, H., "Arbeitsgeschwindigkeitsgrenzen . . . Digitalsignale," Braunschweig, 1978, pp. 116–127.
Gallagher, R. T., "Switching Matrix Delivers 100 Mb/s", Electronics, Dec. 15, 1983, pp. 88–89.
Bauch et al., "Architectural . . . Broadband Switching", ISS '84 Conf. Papers, 23C1, pp. 1–7.
"Three-Port Latch", IBM Technical Disclosure Bulletin, vol. 27, No. 10B, Mar. 1985, pp. 6019–6021.

*Primary Examiner*—Ulysses Weldon
*Attorney, Agent, or Firm*—Hill, Van Santen, Steadman & Simpson

[57] ABSTRACT

A broadband signal cross point switching equipment comprises a cross point matrix having FET switch elements formed with a switching transistor and a holding circuit for providing a through-connect or inhibit signal. The matrix has input lines and output lines and the switching transistor includes a main electrode connected to the respective output line. The switch elements each comprise an auxiliary transistor forming a series circuit with the switching transistor and including a control electrode which is connected to the appertaining matrix input line and a main electrode, facing away from the series circuit, connected by way of a sampling transistor to one terminal of the operating voltage source, to whose other terminal the respective matrix output line is connected by way of a precharging transistor. The precharging transistor and the sampling transistor have their control electrodes charges opposite relative to one another with a switching matrix selection clock and subdivide a bit through connection time interval into a charging phase and an actual through-connect phase so that, given an inhibited sampling transistor, the matrix output line in each preliminary phase is at least approximately charged by way of the precharging transistor to the potential prevailing at the other terminal of the voltage source.

6 Claims, 3 Drawing Sheets

BROADBAND SIGNAL SWITCHING APPARATUS

BACKGROUND OF THE INVENTION

1. Field of the Invention

The present invention relates to broadband signal switching apparatus of the type which comprises cross point matrix constructed in field effect transistor (FET) technology whose switch elements are each formed with a switching transistor charged with a through-connect or, respectively, inhibit signal at its control electrode and having its main electrode connected to the appertaining matrix output line.

2. Description of the Prior Art

Recent developments in telecommunications technology have led to integrated services communications transmission and switching systems for narrow band and broadband communications services which provide light waveguides as transmission media in the region of the subscriber lines by way of which both the narrow band communications services such as, in particular 64 bit/s digital telephony, and broadband communications services such as, in particular, 140 Mbit/s picture telephony, are conducted, whereby narrow band signal switching equipment and broadband signal switching equipment are, however, provided side-by-side in the switching stations (preferably comprising shared control devices such as in the German patent No. 24 21 002).

It is known, in conjunction with broadband signal time-division multiplex switching device whose crosspoints are respectively utilized in time-division multiplex for a plurality of connections, to connect respectively two lines with the assistance of a gate which is switched on and off by a cross-point-associated memory cell constructed as a bistable D flip-flop, whereby this cross point-associated memory cell whose clock input is supplied with a corresponding clock signal is selected in only one coordinate direction, namely at its D input (Pfannschmidt: "Arbeitsgeschwindigkeitsgrenzen von Koppelnetzwerken fur Breitband-Digitalsignale", dissertation, Braunschweig 1978, FIGS. 6.7 and 6.4). In view of the time-division multiplex factor of about 4-8 obtainable given a bit rate of 140 Mbit/s and of the involved circuit technology thereby required, however, pure space switching equipment are currently preferred for switching broadband signals, the connections through-connected via the individual cross points being separated only spatially from one another therein.

A pure broadband signal space switching arrangement can be constructed as a cross point matrix in complementary metal-oxide-semiconductor (CMOS) technology provided with input amplifiers and output amplifiers in whose cross points the switching elements are respectively controlled by a decoder-controlled, cross point-associated holding memory cell, whereby the switching elements are respectively fashioned as CMOS transfer gates (CMOS transmission gate as in ISS'84 Conference Papers 23Cl, FIG. 9); the cross point-associated holding memory cells of a pure space switching matrix can be selected in two coordinates proceeding from a row decoder and from a column decoder, being respectively selected via a row-associated or, respectively, column-associated selection line (Pfannschmidt, OP.CIT, FIG. 6.4).

It is also known in general form (from Electronics, Dec. 15, 1983, pp. 88–89) to provide digital cross points in the form of tristate inverters in a broadband signal cross point matrix, the concrete realization of these, however, still remaining unanswered.

SUMMARY OF THE INVENTION

The object of the present invention is to provide how, in a broadband signal switching equipment, cross points having relatively high working speed and low dissipation of power can be specifically realized with relatively little transistor expense.

According to the invention, the above object is achieved in a broadband signal switching equipment which comprises a cross point matrix constructed in FET technology whose switch elements are each formed with a switching transistor which is charged at its control electrode with a through-connect or, respectively, inhibit signal and has its main electrode connected to the appertaining matrix output line. This broadband signal switching equipment is particularly characterized in that the switch elements each comprise an auxiliary transistor forming a series circuit with the switching transistor, the control electrode thereof being connected to the appertaining matrix input line and the main electrode thereof facing away from the series circuit being connected by way of a sampling transistor to the one terminal of the operating voltage source to whose other terminal the respective matrix output line is connected via a precharging transistor. The apparatus is further particularly characterized in that the precharging transistor and the sampling transistor respectively have their control electrode charged oppositely relative to one another with a switching matrix network selection clock subdividing a bit through-connection time interval into a precharging phase and into the actual through-connect phase, so that, given an inhibited sampling transistor, the matrix output line in each preliminary phase is at least approximately charged via the precharging transistor to the potential prevailing at the mentioned other terminal of the operating voltage source.

The present invention produces the advantage that charge reversals of the matrix output line potentially occurring in the actual bit through-connection always proceed in only one reversing direction from the one operating potential corresponding to a signal state and, therefore, even a small charge reversal (corresponding to the transgression of a threshold neighboring this operating potential value) already involves an unambiguous transition and, therefore, correspondingly fast transition of the through-connected digital signal from the one signal state into the other signal state.

Given a realization of the cross point matrix in CMOS technology, the working speed is further increased in comparison to cross point matrices whose switch elements are formed with CMOS transfer gates and/or CMOS inverters when, according to a further feature of the invention, the switching transistors, auxiliary transistors and sampling transistors are n-channel transistors and at most precharging transistors are p-channel transistors. The p-channel transistors require a larger area because of their high specific resistance and are therefore to be provided, at most, only associated to the matrix output lines, but definitely not in a cross point-associated manner, so that, this being particularly significant given integration, the cross point matrix can be realized with a correspondingly low space requirement and with correspondingly low switch capacitances. Since the dissipated power of the cross point matrix is mainly the charging power to be exerted on the matrix lines, the overall power consumption is also reduced in addition to the charge reversal times given reduced capacitative load of the matrix output lines.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
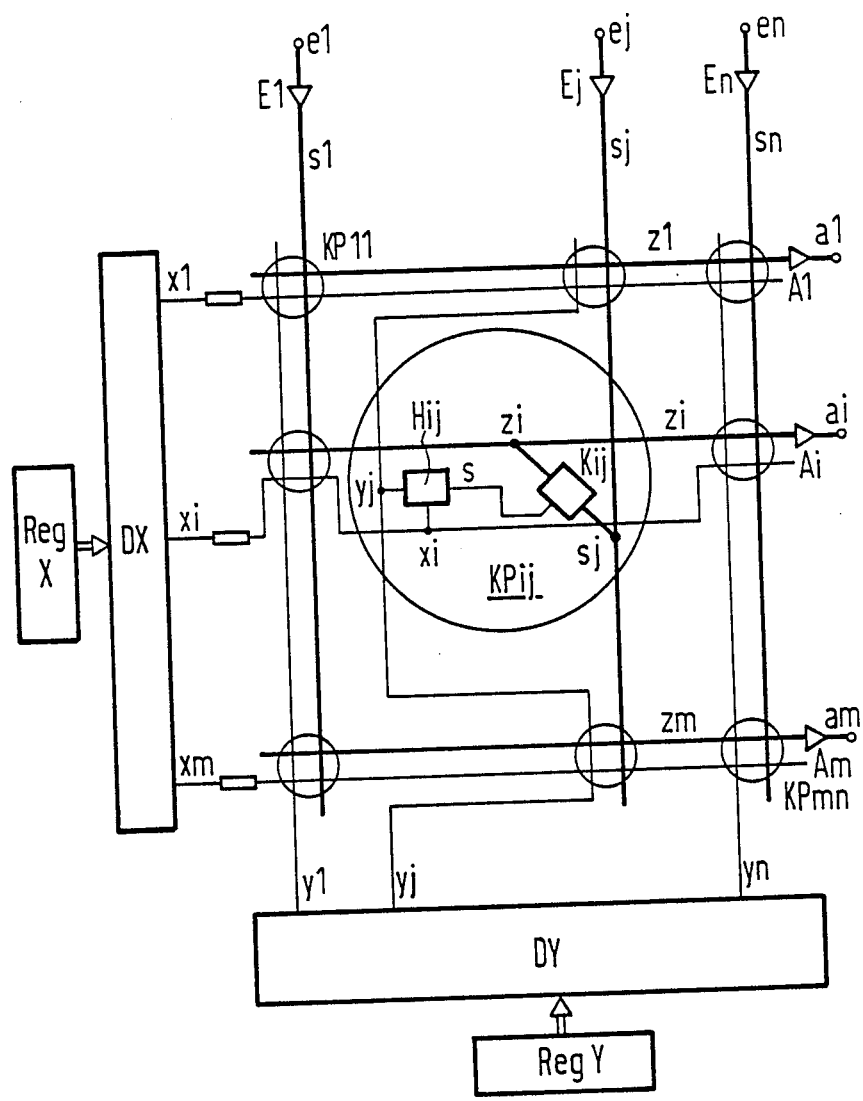
FIG. 1 is a schematic representation of a broadband switching equipment.

Referring to FIG. 1, the drawing schematically illustrates a broadband signal switching equipment with a scope necessary for an understanding of the invention. The equipment comprises input driver circuits E1 ... Ej ... En which are provided at respective inputs e1 ... ej ... en and lead to column lines s1 ... sj ... sn of a cross point matrix. The matrix comprises a plurality of outputs a1 ... ai ... am to which the output signals are provided by way of respective output amplifiers A1 ... Ai ... Am. The cross point matrix comprises cross points KP11 ... KPij ... KPmn each of whose switch elements, as indicated in greater detail at the cross point KPij for the switching element Kij thereof, being capable of being controlled by a cross point-associated holding memory cell Hij (at the cross point KPij) whose output s leads to the control input of the respective switch element (Kij at the cross point KPij). According to FIG. 1, the holding memory cells ... Hij ... are driven by two selection decoders, namely a row decoder DX and a column decoder DY, being selected in two coordinate directions via corresponding selection lines x1 ... xi ... xm and y1 ... yj ... yn.

As may be seen from FIG. 1, the two selection decoders DX, DY are respectively charged proceeding from input registers Reg X, Reg Y with a cross point row or, respectively, cross point column address shared by a matrix line (row or column) of cross points, in response whereto they respectively output a "1" selection signal at the respective selection line respectively corresponding to the cross point line address. The coincidence of a row selection signal "1" and of a column selection signal "1" at the intersection of the appertaining matrix row with the appertaining matrix column in the set-up of a corresponding connection than causes an activation of the holding memory cell located at the point, for example of the memory cell Hij, with the result that the switch element, the switch element Kij in the present example, controlled by the appertaining holding memory cell becomes conductive.

In order for the switch element Kij considered in the example to be inhibited again during clear down of the appertaining connection, the selection decoder DX is again charged with the appertaining row address by the input register Reg X, so that the line decoder DX again outputs the row selection signal "1" on its output line xi; and, at the same time, the column decoder is provided, for example, with a blank address or with the address of a column of unconnected cross points proceeding its input register Reg Y, so that it outputs a column control signal "0" on its output line yj; the coincidence of the row selection signal "1" and the column selection signal "0" then causes the resetting of the holding memory cell Hij, with the coincidence that the switch element Kij it controls is inhibited.

Figure 2:
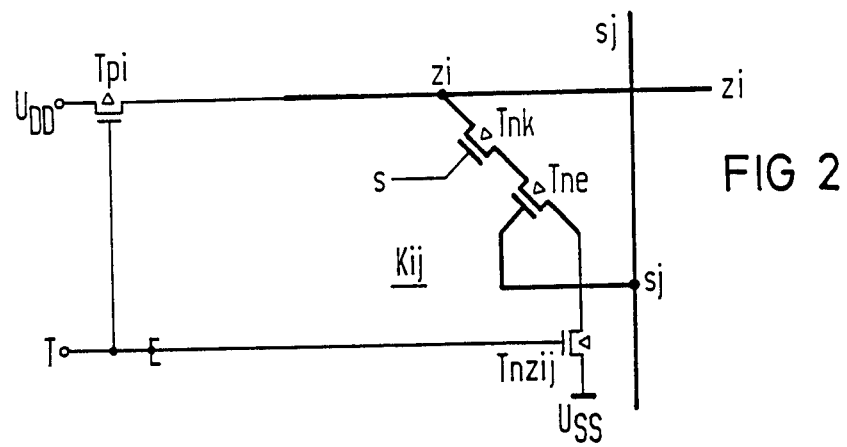
FIG. 2 is a circuit diagram of a first embodiment of a cross point constructed in accordance with the present invention.
Figure 3:
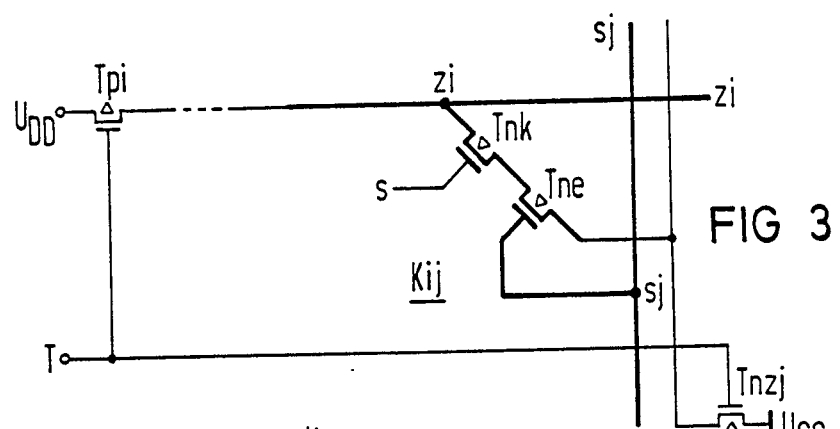
FIG. 3 is a circuit diagram of a second embodiment of a cross point constructed in accordance with the present invention.
Figure 4:
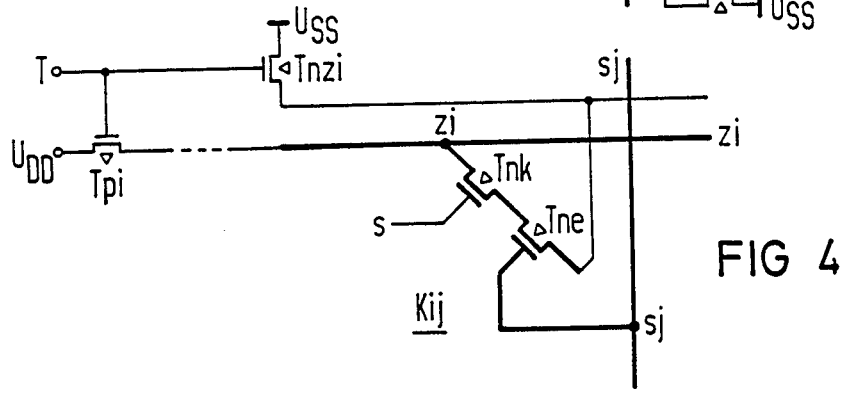
FIG. 4 is a circuit diagram of a third embodiment of a cross point constructed in accordance with the present invention.

FIGS. 2, 3 and 4 illustrate different structures of the switch element, for example the switch element Kij, with circuit details. Each of the switch elements ... Kij ... comprises an auxiliary transistor Tne connected to form a series circuit with a switching transistor Tnk, the auxiliary transistor Tne having its control electrode connected to the appertaining matrix input line (column line) ... sj ... and its main electrode facing away from the series circuit being connected by way of a sampling transistor Tnz (namely Tnzij in FIG. 2, Tnzj in FIG. 3 and Tnzi in FIG. 4) to a terminal $U_{SS}$ (here ground) of the operating voltage source. The respective matrix output line (row line) ... zi ... is connected to the other terminal $U_{DD}$ of the operating voltage source by way of a preloading transistor Tpi.

As also shown in FIG. 2, a respective switch element-associated sampling transistor Tnzij can be provided. Alternatively, however, as shown in FIG. 3, a shared sampling transistor Tnzj shared by all switch elements lying at one end of the same matrix input line (column line) ... sj ... can be provided, this therefore being associated to the matrix input line. Furthermore, as shown in FIG. 4, a sampling transistor Tnzi, shared by all switch elements lying at one and the same matrix output line (row line) ... zi ... can be respectively provided, this being therefore associated with the matrix output line.

As likewise shown in FIGS. 2, 3 and 4, given a cross point matrix constructed in CMOS technology, the switching transistors Tnk, the auxiliary transistors Tne and the sampling transistors Tnz can be n-channel transistors and the preloading transistors Tpi can be p-channel transistors.

Figure 5:
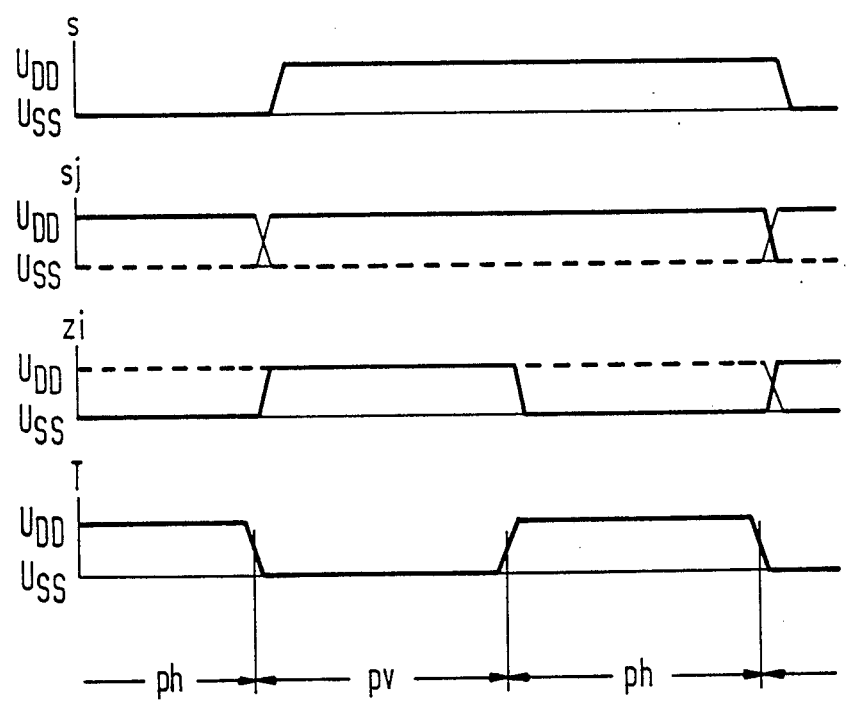
FIG. 5 is a graphic illustration of the signal curves at a cross point.

The preloading transistors Tpi and the sampling transistors Tnz are oppositely charged at their respective control electrodes with a clock T (as indicated in the last line of FIG. 5) subdividing a bit through-connection time interval into a preliminary phase pv and a main phase ph in the manner indicated in FIG. 5.

During the preliminary phase pv (see FIG. 5, bottom), the matrix output lines (row lines) ... zi ... are loaded via the respective preloading transistor Tpi in FIGS. 2, 3 and 4 at least to approximately the operating potential $U_{DD}$, to which end the preloading transistors Tpi formed, for example, by p-channel transistors, are made transmissive by a "low" clock signal T (see FIG. 5, line T) in the example. At the same time, the sampling transistors Tnz (Tnzij in FIG. 2, Tnzj in FIG. 3 and Tnzi in FIG. 4) formed by n-channel transistors are driven in the opposite sense by the same "low" clock signal T in the example, i.e. are inhibited, so that the charging of the matrix output lines (column lines) ... zi ... can proceed independently of the drive of the respective switching transistor Tnk in FIGS. 2, 3 and 4, and of the respective auxiliary transistor Tne in FIGS.

2, 3 and 4, of the individual switch elements ... Kij ... . The potential corresponding to the respective bit to be through-connected may thereby already build up (or, respectively, be retained) on the respective matrix input line (column line) sj ..., as indicated in the line sj of FIG. 5.

In the following main phase ph (FIG. 5, bottom), the preloading transistors Tpi in FIGS. 2, 3 and 4 are inhibited in the example by a "high" clock signal T (see FIG. 5, line T) and, at the same time, the sampling transistors Tnz are unblocked. When the switching transistor Tnk in FIGS. 2, 3 and 4 represented in the example by an n-channel transistor in a switch element ... Kij ... is conductive on the basis of a through-connect signal (see FIG. 5, line s; "high" in the example) applied at the control input s and when the cross point is therefore located in its connected condition, then, dependent on the signal state corresponding to the bit to be through-connected and prevailing on the appertaining matrix input line (column line) ... sj ..., the matrix output line (row line) ... zi ... connected to the matrix input line (column line) ... sj ... via the appertaining switch element ... Kij ... will be discharged or will remain at the potential $U_{DD}$ assumed in the preliminary phase pv.

When, as indicated in FIG. 5, line sj, with a broken line, the "low" signal state prevails on the appertaining matrix input line (column line) sj and when, accordingly, the (n-channel) auxiliary transistor Tne in FIGS. 2, 3 and 4 of the appertaining switch element Kij is inhibited, then the appertaining matrix output line (row line) zi is not discharged via the switch element Kij under consideration is conducted just as the switching transistor Tnk and the appertaining sampling transistor Tnz, then the matrix output line (row line zi) is discharged via the switch element Kij and is pulled to the potential $U_{SS}$.

The respective input signal is therefore through-connected inverted via an unblocked cross point proceeding from its control input s.

In the exemplary embodiments set forth with respect to FIGS. 2, 3 and 4, the preloading transistors Tpi are formed by p-channel transistors, whereby these p-channel preloading transistors Tpi and the sampling transistors Tnz formed by n-channel transistors are oppositely driven by one and the same signal T as a consequence of the different type of channel. In a departure therefrom, however, it is also possible to realize the preloading transistors with n-channel transistors so that, when the switching transistors Tnk, the auxiliary transistors Tne and the sampling transistors Tnz are also n-channel transistors, only transistors of the one and same channel type are utilized. In order for the preloading transistors and sampling transistors then be again oppositely charged at their respective control electrodes with the switching matrix network selection clock, the switching matrix network selection clock is again to be directly supplied to the sampling transistors Tnz, as in the exemplary embodiments described with reference to FIGS. 2, 3 and 4, but the inverted switching matrix network selection clock signal is to be supplied to the n-channel preloading transistors.

The following should also be noted in summary of the foregoing discussion.

In the broadband signal switching equipment shown in FIG. 1, the switch elements Kpij ... in and belonging to the individual cross points ... Kpij ... have their control input s controlled by cross point-associated (holding) memory elements ... Hij ... which are, in turn, designationally selected by address decoders lying outside of the actual cross point matrix. Such a selection of the cross points, which is fundamentally known in the art, is particularly advantageous when the respective inhibited or, respectively, through-connect condition of a cross point is retained for a comparatively long time and is changed relatively rarely, as may be the case particularly when switching what are referred to as distribution services.

The invention, however, is not restricted to such a selection of the cross points; departing from the illustration in FIG. 1, by contrast, it is also possible to arrange the holding memory circuits required for the cross point selection externally as address registers, i.e. outside of the actual cross point matrix, and to integrate the address decoders required for cross point selection in the cross point matrix in the form of cross point-associated decoder elements (logic elements). Such a selection of the cross points, which is likewise fundamentally known (for example, from Kunze, "TIDES: A New Concept in Time Division Electronic Switching", papers presented at COLLOQUE INTERNATIONAL de COMMUTATION ELECTRONIQUE, Paris 1966, EDITIONS CHIRON, pp. 301–312) is especially expedient when the respective inhibited or, respectively, through-connect condition of a cross point is respectfully retained for only a comparatively short time and is changed relatively frequently, as may particularly be the case in a bit-by-bit switching of voice services.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a broadband signal switching equipment of the type which is constructed in field effect transistor technology and of the type which includes a cross point matrix which comprises a first matrix of input lines and output lines which intersect to define cross points, and a second matrix of first selection lines and second selection lines which intersect at the cross points, and in which each cross point comprises a switching element including a switching transistor including a first main electrode connected to the respective output line, a second main electrode connectible to a first potential, and a control electrode for receiving a through-connect signal or an inhibit signal, and a holding circuit including selection inputs connected to respective first and second selection lines at the respective cross point and an output connected to said control electrode of said switching transistor, the improvement therein comprising:

an auxiliary transistor including a first main electrode connected to said second main electrode of said switching transistor, a second main electrode connectible to the first potential, and a control electrode connected to the respective input line; p1 a plurality of precharging transistors each including a pair of main electrodes connected in series between a respective output line and a second potential, and a control electrode for receiving a clock signal; and a sampling transistor operable to divide a bit through-connection interval into a precharging phase and a through-connect phase, said sampling transistor including a control electrode for receiving a clock signal, and a pair of main electrodes connected between said second main electrode of said auxiliary transistor and the first potential, said sampling transistor and said precharging transistor oppositely operable in response to the clock signals so that the respective matrix output line is charged via the precharging transistor to at least approximately the potential prevailing at the second potential in each precharging phase given an inhibited respective sampling transistor.

2. The broadband signal switching equipment of claim 1, wherein:

said switching transistors, said auxiliary transistors and said sampling transistors are n-channel transistors and said precharging transistors are p-channel transistors.

3. The broadband signal switching equipment of claim 1, wherein:

said switching transistors, said auxiliary transistors, said sampling transistors and said precharging transistors are n-channel transistors.

4. The broadband signal switching equipment of claim 1, wherein:

a respective sampling transistor is located at each cross point.

5. The broadband signal switching equipment of claim 1, wherein:

a respective sampling transistors is connected to each auxiliary transistor of a respective matrix input line.

6. The broadband signal switching equipment of claim 1, wherein:

a respective sampling transistor is connected to each auxiliary transistor of a respective matrix output line.

* * * * *